United States Patent
Ma et al.

(10) Patent No.: US 12,108,684 B2
(45) Date of Patent: Oct. 1, 2024

(54) MAGNETIC TUNNELING JUNCTION ELEMENT WITH A COMPOSITE CAPPING LAYER AND MAGNETORESISTIVE RANDOM ACCESS MEMORY DEVICE USING THE SAME

(71) Applicant: HeFeChip Corporation Limited, Sai Ying Pun (HK)

(72) Inventors: Qinli Ma, Mt Kisco, NY (US); Wei-Chuan Chen, Scarsdale, NY (US); Youngsuk Choi, Niskayuna, NY (US); Shu-Jen Han, Armonk, NY (US)

(73) Assignee: HEFECHIP CORPORATION LIMITED, Sai Ying Pun (HK)

( * ) Notice: Subject to any disclaimer, the term of this patent is extended or adjusted under 35 U.S.C. 154(b) by 681 days.

(21) Appl. No.: 17/315,345

(22) Filed: May 9, 2021

(65) Prior Publication Data
US 2021/0265561 A1 Aug. 26, 2021

Related U.S. Application Data

(63) Continuation-in-part of application No. 16/517,649, filed on Jul. 21, 2019, now abandoned.

(51) Int. Cl.
*H10N 50/80* (2023.01)
*G11C 11/16* (2006.01)
(Continued)

(52) U.S. Cl.
CPC .......... *H10N 50/80* (2023.02); *G11C 11/161* (2013.01); *H01F 10/3254* (2013.01);
(Continued)

(58) Field of Classification Search
CPC ........ H10B 61/00; H10B 61/10; H10B 61/20; H10B 61/22; G11C 2211/5615;
(Continued)

(56) References Cited

U.S. PATENT DOCUMENTS 6,396,671 B1 5/2002 Horng
7,760,474 B1 7/2010 Huai
(Continued)

FOREIGN PATENT DOCUMENTS

WO 2016/039852 A1 3/2016

OTHER PUBLICATIONS

S. Ikeda et al., Nature materials, a perpendicular-anisotropy CoFeB—MgO magnetic tunnel junction, vol. 9, p. 721-724, Jul. 11, 2010.
(Continued)

*Primary Examiner* — Didarul A Mazumder
*Assistant Examiner* — Gustavo G Ramallo
(74) *Attorney, Agent, or Firm* — Muncy, Geissler, Olds & 1Lowe, P.C.

(57) ABSTRACT

A magnetic tunneling junction (MTJ) element includes a reference layer, a tunnel barrier layer on the reference layer, a free layer on the tunnel barrier layer, and a composite capping layer on the free layer. The composite capping layer comprises a diffusion-stop layer on the free layer, a light-element sink layer on the diffusion-stop layer, and an amorphous layer on the light-element sink layer.

36 Claims, 3 Drawing Sheets

(51) Int. Cl.
*H01F 10/32* (2006.01)
*H10B 61/00* (2023.01)
*H10N 50/85* (2023.01)

(52) U.S. Cl.
CPC ........... *H01F 10/329* (2013.01); *H10B 61/22* (2023.02); *H10N 50/85* (2023.02); *H01F 10/3286* (2013.01)

(58) Field of Classification Search
CPC ........ G01R 33/09; G01R 33/098; G11B 5/39; G11B 5/3909; H10N 50/10; H10N 50/80; H10N 50/85
See application file for complete search history.

(56) References Cited

U.S. PATENT DOCUMENTS

| | | | |
|---|---|---|---|
| 8,871,530 B1 | 10/2014 | Hu | |
| 9,337,415 B1 | 5/2016 | Oh | |
| 9,601,687 B2 | 3/2017 | Park | |
| 9,837,468 B2* | 12/2017 | Kim | H10N 50/10 |
| 2004/0041183 A1 | 3/2004 | Slaughter | |
| 2004/0227172 A1* | 11/2004 | Park | H10B 61/22 |
| | | | 257/E27.005 |
| 2005/0201020 A1 | 9/2005 | Fuke | |
| 2005/0276996 A1 | 12/2005 | Hong | |
| 2006/0208296 A1 | 9/2006 | Horng | |
| 2013/0088914 A1* | 4/2013 | Ranjan | H10N 50/10 |
| | | | 365/171 |
| 2013/0177781 A1 | 7/2013 | Chepulskyy | |
| 2014/0103469 A1 | 4/2014 | Jan | |
| 2014/0154529 A1 | 6/2014 | Yang | |
| 2014/0185182 A1* | 7/2014 | Hsieh | H01L 21/02271 |
| | | | 361/301.4 |
| 2015/0104882 A1 | 4/2015 | Jung | |
| 2015/0129997 A1 | 5/2015 | Tang | |
| 2016/0072054 A1* | 3/2016 | Guo | H10N 50/01 |
| | | | 257/421 |
| 2017/0125045 A1 | 5/2017 | Faleev | |
| 2017/0353225 A1 | 12/2017 | Mizunuma | |
| 2018/0248116 A1 | 8/2018 | Doczy | |
| 2019/0019944 A1* | 1/2019 | Sato | G11C 11/1695 |
| 2019/0027169 A1 | 1/2019 | Xue | |
| 2019/0123263 A1 | 4/2019 | Park | |
| 2020/0006425 A1 | 1/2020 | Lin | |
| 2020/0052192 A1 | 2/2020 | Ma | |
| 2020/0158796 A1 | 5/2020 | Ikhtiar | |
| 2020/0295256 A1 | 9/2020 | Hashemi | |

OTHER PUBLICATIONS

H. Sato et al., Applied Physics Letters 101, 022414(2012), Perpendicular-anisotropy CoFeB—MgO magnetic tunnel junctions with a MgO/CoFeB/Ta/CoFeB/MgO recording structure, 2012 American Institute of Physics, Jul. 13, 2012.

D. C. Worledge et al., Applied Physics Letters 98, 022501 (2011), Spin torque switching of perpendicular Ta|CoFeB|MgO-based magnetic tunnel junctions, 2011 American Institute of Physics, Jan. 10, 2011.

* cited by examiner

MAGNETIC TUNNELING JUNCTION ELEMENT WITH A COMPOSITE CAPPING LAYER AND MAGNETORESISTIVE RANDOM ACCESS MEMORY DEVICE USING THE SAME

CROSS REFERENCE TO RELATED APPLICATIONS

This is a continuation-in-part of U.S. application Ser. No. 16/517,649 filed Jul. 21, 2019, which is included in its entirety herein by reference.

BACKGROUND OF THE INVENTION

1. Field of the Invention

The invention relates to a semiconductor memory device, and more particularly, to a magnetic tunneling junction (MTJ) element with a composite capping layer interposed between a top electrode and a free layer of the MTJ element.

2. Description of the Prior Art

Magnetoresistive random access memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines such as word lines on a horizontal plane, an array of parallel second conductive lines such as bit lines on a second horizontal plane spaced above and formed in a direction perpendicular to the first conductive lines, and a MTJ element interposed between a first conductive line and a second conductive line at each crossover location. Typically, access transistors may be disposed below the array of first conductive lines to select certain MRAM cells within the MRAM array for read or write operations.

A MTJ element may be based on a tunneling magneto-resistance (TMR) effect wherein a stack of layers has a configuration in which two ferromagnetic layers are separated by a thin non-magnetic dielectric layer. If the non-magnetic dielectric layer is thin enough (typically a few nanometers), electrons can tunnel from one ferromagnet into the other. In a MRAM device, the MTJ element is typically formed between a bottom electrode and a top electrode. A MTJ stack of layers that is subsequently patterned to form a MTJ element may be formed by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction.

Typically, a ruthenium (Ru) top electrode or via is disposed between the free layer of the MTJ stack and the bit line. The Ru top electrode has hexagonal close packed (hcp) crystalline structure, which adversely affects the underlying free layer and may cause magneto-resistance (MR) drop and increase of the distribution of coercivity (Hc) of the free layer. To cope with these problems, some approaches use an amorphous layer such as Ta or Ti as the capping layer on the free layer. However, Ta or Ti may diffuse into the free layer and cause the reduction of perpendicular anisotropy field (Hk) of the free layer, thus adversely affects the retention of the MRAM devices.

SUMMARY OF THE INVENTION

It is one object to provide an improved magnetic tunneling junction (MTJ) element with a composite capping layer in order to solve the above-described prior art shortcomings or problems.

According to one aspect of the invention, a magnetic tunneling junction (MTJ) element includes a reference layer, a tunnel barrier layer on the reference layer, a free layer on the tunnel barrier layer, and a composite capping layer on the free layer. The composite capping layer comprises a diffusion-stop layer on the free layer, a light-element sink layer on the diffusion-stop layer, and an amorphous layer on the light-element sink layer.

According to some embodiments, the diffusion-stop layer is in direct contact with the free layer and forms a first interface with the free layer.

According to some embodiments, the amorphous layer is in direct contact with a top electrode and forms a second interface with the top electrode.

According to some embodiments, the top electrode is a ruthenium top electrode having a hexagonal close packed (hcp) crystalline structure According to some embodiments, the top electrode electrically connects the MTJ element to a bit line.

According to some embodiments, the composite capping layer is in direct contact with a non-magnetic layer of the free layer.

According to some embodiments, the composite capping layer is in direct contact with a cap layer of the free layer.

According to some embodiments, the cap layer of the free layer comprises MgO.

According to some embodiments, the amorphous layer is made of metals having amorphous structure and has a thickness of about 0.1 nm to 5.0 nm.

According to some embodiments, the amorphous layer comprises non-magnetic metals including Mg or Al, magnetic metals including CoFeB, or oxides including AlO, MgO, TaO$_2$ or RuO.

According to some embodiments, the light-element sink layer is made of metals having ability of absorbing light elements diffused from the free layer.

According to some embodiments, the light-element sink layer comprises non-magnetic metals including Ta, Ti or Zr or magnetic materials including Fe or its alloys.

According to some embodiments, the diffusion-stop layer is made of materials having low mobility at high temperature of above 400° C.

According to some embodiments, the diffusion-stop layer comprises non-magnetic metals including Ru, Mo, W or alloys thereof, or oxides including MgO, TaO, AlO.

According to some embodiments, the tunnel barrier layer comprises an insulator comprising MgO, AlO$_x$, MgAlO, MgZnO, HfO, or any combination thereof.

According to some embodiments, the free layer comprises Fe, Co, B, Ni, or any combination thereof.

According to some embodiments, the reference layer comprises a magnetic material comprising Co and Fe.

According to some embodiments, the reference layer comprises CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

According to some embodiments, the reference layer comprises a magnetic superlattice structure comprising repeated alternating layers of two or more materials, including $(Co/Pt)_n$, $(Co/Pd)_n$, $(Co/Ni)_n$, $(CoFe/Pt)_n$, $(Co/Pt(Pd))_n$, or any combination thereof.

According to some embodiments, the reference layer is disposed on a bottom electrode comprising NiCr, Ru, Cu, Ta, TaN, Ti, TiN, or any combination thereof.

According to another aspect of the invention, a magnetoresistive random access memory (MRAM) device includes at least one magnetic tunneling junction (MTJ) element including a reference layer; a tunnel barrier layer on the reference layer; a free layer on the tunnel barrier layer; and a composite capping layer on the free layer. The composite capping layer comprises a diffusion-stop layer on the free layer, a light-element sink layer on the diffusion-stop layer, and an amorphous layer on the light-element sink layer.

According to some embodiments, the diffusion-stop layer is in direct contact with the free layer and forms a first interface with the free layer.

According to some embodiments, the amorphous layer is in direct contact with a top electrode and forms a second interface with the top electrode.

According to some embodiments, the top electrode is a ruthenium top electrode having a hexagonal close packed (hcp) crystalline structure.

According to some embodiments, the amorphous layer is made of metals having amorphous structure and has a thickness of about 0.1 nm to 5.0 nm.

According to some embodiments, the amorphous layer comprises non-magnetic metals including Ta, Ti or Al, magnetic metals including CoFeB, FeB or CoB, or oxides including AlO, MgO, $TaO_2$ or RuO.

According to some embodiments, the light-element sink layer is made of metals having ability of absorbing light elements diffused from the free layer.

According to some embodiments, the light-element sink layer comprises non-magnetic metals including Ta, Ti or Zr or magnetic materials including Fe or its alloys.

According to some embodiments, the diffusion-stop layer is made of materials having low mobility at high temperature of above 400° C.

According to some embodiments, the diffusion-stop layer comprises non-magnetic metals including Ru, Mo, W or alloys thereof, or oxides including MgO, TaO, AlO.

According to some embodiments, the tunnel barrier layer comprises an insulator comprising MgO, $AlO_x$, MgAlO, MgZnO, HfO, or any combination thereof.

According to some embodiments, the free layer comprises Fe, Co, B, Ni, or any combination thereof.

According to some embodiments, the reference layer comprises a magnetic material comprising Co and Fe.

According to some embodiments, the reference layer comprises CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

According to some embodiments, the reference layer comprises a magnetic superlattice structure comprising repeated alternating layers of two or more materials, including $(Co/Pt)_n$, $(Co/Pd)_n$, $(Co/Ni)_n$, $(CoFe/Pt)_n$, $(Co/Pt(Pd))_n$, or any combination thereof.

According to some embodiments, the reference layer is disposed on a bottom electrode comprising NiCr, Ru, Cu, Ta, TaN, Ti, TiN, or any combination thereof.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
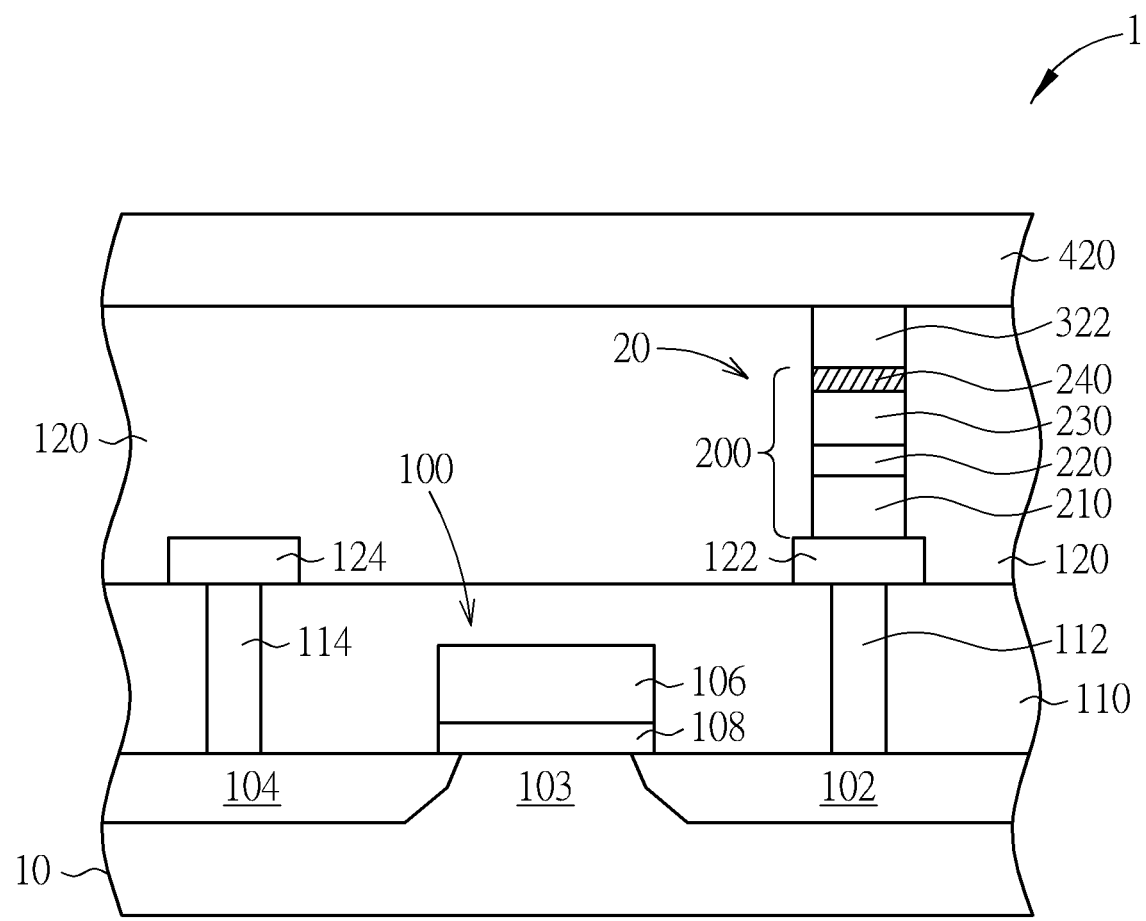
FIG. 1 is a schematic, cross-sectional diagram showing an exemplary 1T1MTJ structure of a MRAM device according to a non-limiting embodiment of the present invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure pertains to an improved magnetic tunneling junction (MTJ) element of a magnetoresistive random access memory (MRAM) device such as a spin-transfer torque magnetoresistive random access memory (STT-MRAM) device. STT-MRAM is a non-volatile memory, which has several advantages over the conventional magnetoresistive random access memory. For example, these advantages include higher scalability, lower-power consumption, and faster operating speed. Spin transfer torque is an effect in which the orientation of a magnetic layer in a magnetic tunnel junction or spin valve can be modified using a spin-polarized current. STT-MRAM uses electrons that become spin-polarized as the electrons pass through a thin film (spin filter). During a write operation, the spin-polarized electrons exert torque on a free layer, which switches a polarity of the free layer. During a read operation, a current detects the resistance/logic state of the MTJ storage element.

The present disclosure is characterized in that the MTJ element comprises a composite capping layer interposed between a free layer of the MTJ element and a top electrode/via disposed on the MTJ element. The top electrode/via may be composed of ruthenium (Ru) and may have a hexagonal close packed (hcp) crystalline structure. For example, the top electrode/via electrically connects the MTJ element to an overlying bit line.

For example, an MRAM device may include memory cells composed of synthetic anti-ferromagnet (SAF). The SAF denotes a layered ferromagnetic structure in which adjacent ferromagnetic layers are antiferromagnetically coupled. For example, an MTJ element may be provided at an intersection of a word line and a bit line. Generally, the MTJ element may be composed of an antiferromagnetic layer, a fixed magnetic layer (or a reference layer), a tunnel barrier layer and a free magnetic layer (or a free layer).

Materials used to form MTJ stacks of a MRAM device generally exhibit high tunneling magneto resistance (TMR), high perpendicular magnetic anisotropy (PMA) and good data retention. MTJ structures may be made in a perpendicular orientation, referred to as perpendicular magnetic tunnel junction (pMTJ) devices. A stack of materials (e.g., cobalt-iron-boron (CoFeB) materials) with a dielectric barrier layer (e.g., magnesium oxide (MgO)) may be used in a pMTJ structure. For example, a pMTJ structure including a stack of materials (e.g., CoFeB/MgO/CoFeB) may be considered for use in MRAM structures.

FIG. 1 is a schematic, cross-sectional diagram showing an exemplary one-transistor-one-MTJ (1T1MTJ) structure of a MRAM device 1 according to a non-limiting embodiment of the present invention. As shown in FIG. 1, the MRAM device 1 comprises a substrate 10 having a top surface 10a. For example, the substrate 10 may be a silicon substrate, a silicon-on-insulator (SOI) substrate, or any suitable semiconductor substrates known in the art.

According to one embodiment, an access transistor 100 may be formed on the top surface 10a of the substrate 10. The access transistor 100 may comprise a drain doping region 102 and a source doping region 104 spaced apart from the drain doping region 104. The drain doping region 102 and the source doping region 104 may be formed by ion implantation process and may be formed in the substrate 10. A channel region 103 may be formed between the drain doping region 102 and the source doping region 104. A gate 106 may be formed over the channel region 103. A gate dielectric layer 108 such as a silicon oxide layer may be formed between the gate 106 and the channel region 103.

It is to be understood that the MRAM device 1 may comprise peripheral circuits for supporting the MRAM memory array. The peripheral circuits may be formed in a logic circuit area, which is not shown for the sake of simplicity.

An inter-layer dielectric (ILD) layer 110 such as an ultra-low k (ULK) dielectric layer may be deposited over the substrate 10. The ILD layer 110 covers the gate 106, the drain doping region 102, and the source doping region 104 of the transistor 100. A contact plug 112 and a contact plug 114 may be formed directly on the drain doping region 102 and the source doping region 104, respectively, in the ILD layer 110. For example, the contact plug 112 and the contact plug 114 may comprise Cu, Ti, TiN, Ta, TaN, W, alloys or combinations thereof, but is not limited thereto. An inter-layer dielectric (ILD) layer 120 may be deposited over the ILD layer 110.

According to one embodiment, a cylindrical memory stack 20 may be formed on the contact plug 112 in the ILD layer 120. The cylindrical memory stack 20 may comprise a magnetic tunneling junction (MTJ) element 200 sandwiched by a bottom electrode 122 and a top electrode 322. The MTJ element 200 is electrically coupled to the drain doping region 102 through the bottom electrode 122 and the contact plug 112. For example, the bottom electrode 122 may comprise NiCr, Ru, Cu, Ta, TaN, Ti, TiN, or any combination thereof.

According to one embodiment, the MTJ element 200 may comprise layered structure including, but not limited to, a reference layer (or pinned layer) 210, a tunnel barrier layer 220 stacked directly on the reference layer 210, and a free layer 230 stacked directly on the tunnel barrier layer 220. According to one embodiment, the reference layer 210 may comprise a pinned layer, an anti-ferromagnetic (AFM) layer, and a polarization enhancement layer (PEL), but is not limited thereto.

For example, the reference layer 210 may be formed of a magnetic material comprising Co and Fe, including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof. Moreover, the reference layer 210 may also have a magnetic superlattice structure comprising repeated alternating layers of two or more materials, such as but not limited to $(Co/Pt)_n$, $(Co/Pd)_1$, $(Co/Ni)_n$, $(CoFe/Pt)_n$, $(Co/Pt(Pd))_1$, or any combination thereof. Alternatively, the reference layer 210 may be formed of a magnetic material comprising Co and Cr, including but not limited to CoCr, CoCrB, CoCrPt, CoCrPtB, CoCrPd, CoCrTi, CoCrZr, CoCrHf, CoCrV, CoCrNb, CoCrTa, or any combination thereof.

According to one embodiment, the tunnel barrier layer 220 may comprise an insulator, including but not limited to MgO, AlO$_x$, MgAlO, MgZnO, HfO, or any combination thereof. According to one embodiment, the tunnel barrier layer 220 may have a thickness of about 0.5 nm-3.0 nm.

According to one embodiment, the free layer 230 may comprise ferromagnetic materials. For example, the free layer 230 may be a single layer or multi-layer structure. For example, the free layer 230 may comprise Fe, Co, B, Ni, or any combination thereof. For example, the free layer 230 may be formed of a magnetic material including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

Figure 2:
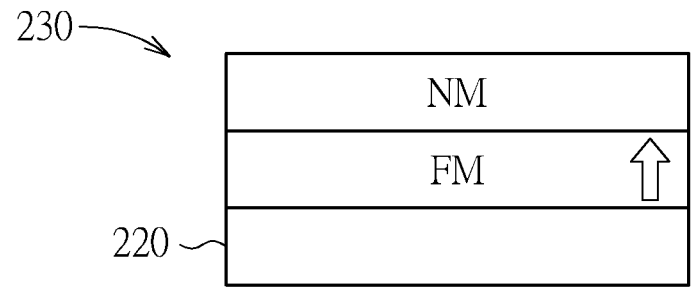
FIG. 2 and FIG. 3 illustrate two exemplary configuration of the free layer of the MTJ element in FIG. 1.
Figure 3:
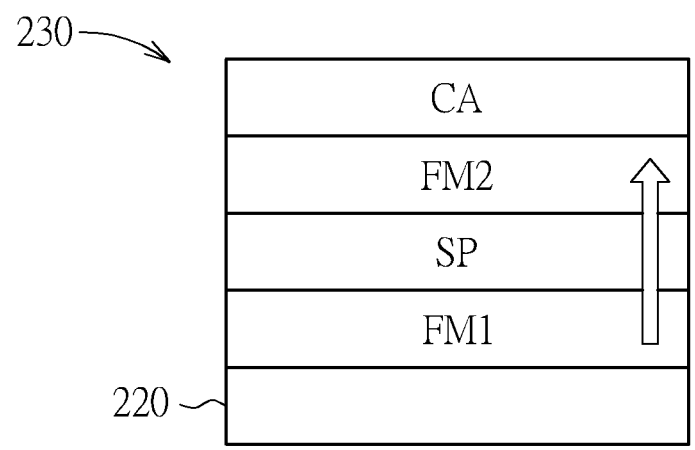

FIG. 2 and FIG. 3 illustrate two exemplary configuration of the free layer 230 of the MTJ element in FIG. 1. In FIG. 2, the free layer 230 comprises a ferromagnetic layer FM disposed directly on the tunnel barrier layer 220. For example, the tunnel barrier layer 220 may be made of MgO. A non-magnetic layer NM may be disposed directly on the ferromagnetic layer FM. This type of free layer has advantages of small damping compared with other PMA materials and high TMR in MgO-based MTJ. However, the free layer in FIG. 2 has limited thickness (~15 angstroms), thus low PMA. In FIG. 3, the free layer 230 comprises a non-magnetic spacer layer SP is sandwiched by two ferromagnetic layers FM1 and FM2. The spacer layer SP may comprise Ta, Mo, W, Ir, Rh, Zr, Nb, Hf, Cr, V, Bi, any combination thereof, or an alloy with one or more of CFe, Co, Ni, Mn, or other magnetic elements. For example, the spacer layer SP may have a thickness of about 0.1 nm to 2.0 nm. A cap layer CA may be disposed on top of the ferromagnetic layer FM2. For example, the cap layer CA may be composed of MgO, AlOx, TiOx, HfOx, MgAlOx, MgZnOx, SiOx, TaOx, VOx, or any combination thereof. The interface between the ferromagnetic layer FM2 and the cap layer CA enhances PMA. The cap layer CA may have a resistance-area product (RA) less than that of the tunnel barrier layer 220. The cap layer CA may have a thickness of about 0.1 nm to 2.0 nm.

According to one embodiment, the MTJ element 200 may further comprise a composite capping layer 240 interposed between the top electrode 322 and the free layer 230. According to one embodiment, the top electrode 322 may be made of ruthenium (Ru) having a hexagonal close packed (hcp) crystalline structure. The top electrode 322 also acts as an etching stopper, for example, during an ion beam etching process. The MTJ element 200 is electrically connected to an overlying bit line 420 through the top electrode 322. As previously described, the hcp crystalline structure of the Ru top electrode 322 adversely affects the underlying free layer and may cause magneto-resistance (MR) drop and increase of the distribution of coercivity (Hc) of the free layer. The present disclosure addresses these issues by providing the composite capping layer 240 between the top electrode 322 and the free layer 230.

The composite capping layer 240 between the top electrode 322 and the free layer 230 can provide the following advantages. First, the high Hk of the free layer 230 and high TMR ratio of the MTJ element 200 can be maintained. Second, the composite capping layer 240 can act as a diffusion barrier layer that can block element diffusion from the top electrode/via. Third, the composite capping layer 240 also acts as a crystalline barrier that can avoid the hcp crystalline structure of the top electrode from affecting the free layer.

Figure 4:
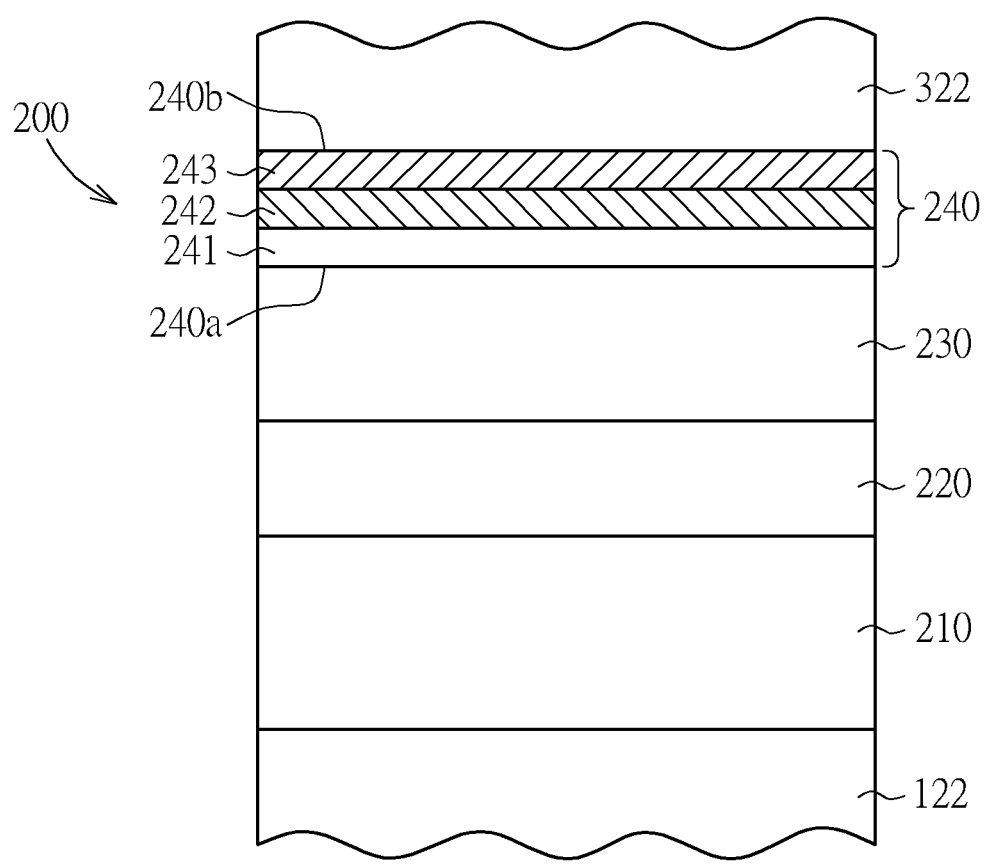
FIG. 4 is an enlarged, cross-sectional diagram showing the MTJ element with the composite capping layer according to one embodiment of the invention.

FIG. 4 is an enlarged, cross-sectional diagram showing the MTJ element 200 with the composite capping layer 240 according to one embodiment of the invention, wherein like numeral numbers designate like regions, elements or layers. As shown in FIG. 4, the composite capping layer 240 may comprise a combination of at least two of different functional layers including a diffusion-stop layer 241, a light-element sink layer 242, and an amorphous layer 243. For illustration purposes, the three layers 241-243 are all shown in FIG. 4. The order of these layers 241, 242, and 243 can be arranged differently based on the required functions, and of the composite capping layer 240 may have more than one of each of these layers 241, 242, and 243 if certain property needs be enhanced. The composite capping layer 240 is in direct contact with the free layer 230 and forms an interface 240a with the free layer 230. The composite capping layer 240 is in direct contact with the top electrode 322 and forms an interface 240b with the top electrode 322.

In a case that the free layer 230 has a structure as depicted in FIG. 2, the composite capping layer 240 is in direct contact with the non-magnetic layer NM. In a case that the free layer 230 has a structure as depicted in FIG. 3, the composite capping layer 240 is in direct contact with the cap layer CA such as MgO.

According to one embodiment, the amorphous layer 243 is made of metals having amorphous structure and may have a thickness of about 0.1 nm to 5.0 nm. For example, the amorphous layer 241 may comprise non-magnetic metals such as Mg or Al, magnetic metals such as CoFeB, FeB or CoB, or oxides such as AlO, MgO, TaO$_2$ or RuO, but is not limited thereto.

According to one embodiment, the light-element sink layer 242 is made of metals having ability of absorbing light elements such as B diffused from the free layer 230. For example, the light-element sink layer 242 may comprise non-magnetic metals such as Ta, Ti or Zr or magnetic materials such as Fe or its alloys, but is not limited thereto. According to one embodiment, the light-element sink layer 242 may have a thickness of about 0.1 nm to 5.0 nm.

According to one embodiment, the diffusion-stop layer 241 is made of materials that is capable of preventing elements such as Zr or Ta of the light-element sink layer 242 from diffusing into the free layer 230 at high temperature of above 400° C. For example, the diffusion-stop layer 241 may comprise non-magnetic metals such as Ru, Mo, W or their alloys or oxides such as MgO, TaO, AlO, but is not limited thereto. According to one embodiment, the diffusion-stop layer 243 may have a thickness of about 0.1 nm to 5.0 nm.

It is advantageous to use the present disclosure because the composite capping layer 240 between the top electrode 322 and the free layer 230 can maintain high Hk of the free layer. Besides, the crystalline of the Ru top electrode can be effectively suppressed by the amorphous layer 243, thus the distribution of Hc and TMR ratio of the MRAM device 1 can be significantly improved. Furthermore, by using the light-element sink layer 242 in the composite capping layer 240, the MR ratio can be improved. The diffusion-stop layer 241 is capable of preventing elements such as Zr or Ta of the light-element sink layer 242 from diffusing into the free layer 230.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic tunneling junction (MTJ) element, comprising:
 a reference layer;
 a tunnel barrier layer on the reference layer;
 a free layer on the tunnel barrier layer; and
 a composite capping layer on the free layer, wherein the composite capping layer comprises a diffusion-stop layer on the free layer, a light-element sink layer on the diffusion-stop layer, and an amorphous layer on the light-element sink layer, wherein the amorphous layer is in direct contact with the light-element sink layer.

2. The MTJ element according to claim 1, wherein the diffusion-stop layer is in direct contact with the free layer and forms a first interface with the free layer.

3. The MTJ element according to claim 2, wherein the amorphous layer is in direct contact with a top electrode and forms a second interface with the top electrode.

4. The MTJ element according to claim 3, wherein the top electrode is a ruthenium top electrode having a hexagonal close packed (hcp) crystalline structure.

5. The MTJ element according to claim 3, wherein the top electrode electrically connects the MTJ element to a bit line.

6. The MTJ element according to claim 1, wherein the composite capping layer is in direct contact with a non-magnetic layer of the free layer.

7. The MTJ element according to claim 1, wherein the composite capping layer is in direct contact with a cap layer of the free layer.

8. The MTJ element according to claim 7, wherein the cap layer of the free layer comprises MgO.

9. The MTJ element according to claim 1, wherein the amorphous layer is made of metals having amorphous structure and has a thickness of about 0.1 nm to 5.0 nm.

10. The MTJ element according to claim 9, wherein the amorphous layer comprises non-magnetic metals including Mg or Al, magnetic metals including CoFeB, or oxides including AlO, MgO, $TaO_2$ or RuO.

11. The MTJ element according to claim 1, wherein the light-element sink layer is made of metals having ability of absorbing light elements diffused from the free layer.

12. The MTJ element according to claim 11, wherein the light-element sink layer comprises non-magnetic metals including Ta, Ti or Zr or magnetic materials including Fe or its alloys.

13. The MTJ element according to claim 1, wherein the diffusion-stop layer is made of materials having low mobility at high temperature of above 400° C.

14. The MTJ element according to claim 13, wherein the diffusion-stop layer comprises non-magnetic metals including Ru, Mo, W or alloys thereof, or oxides including MgO, TaO, AlO.

15. The MTJ element according to claim 1, wherein the tunnel barrier layer comprises an insulator comprising MgO, $AlO_x$, MgAlO, MgZnO, HfO, or any combination thereof.

16. The MTJ element according to claim 1, wherein the free layer comprises Fe, Co, B, Ni, or any combination thereof.

17. The MTJ element according to claim 1, wherein the reference layer comprises a magnetic material comprising Co and Fe.

18. The MTJ element according to claim 1, wherein the reference layer comprises CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

19. The MTJ element according to claim 1, wherein the reference layer comprises a magnetic superlattice structure comprising repeated alternating layers of two or more materials, including $(Co/Pt)_n$, $(Co/Pd)_n$, $(Co/Ni)_n$, $(CoFe/Pt)_n$, $(Co/Pt(Pd))_n$, or any combination thereof.

20. The MTJ element according to claim 1, wherein the reference layer is disposed on a bottom electrode comprising NiCr, Ru, Cu, Ta, TaN, Ti, TiN, or any combination thereof.

21. A magnetoresistive random access memory (MRAM) device, comprising:
 at least one magnetic tunneling junction (MTJ) element comprising: a reference layer; a tunnel barrier layer on the reference layer; a free layer on the tunnel barrier layer; and a composite capping layer on the free layer, wherein the composite capping layer comprises a diffusion-stop layer on the free layer, a light-element sink layer on the diffusion-stop layer, and an amorphous layer on the light-element sink layer, wherein the amorphous layer is in direct contact with the light-element sink layer.

22. The MRAM device according to claim 21, wherein the diffusion-stop layer is in direct contact with the free layer and forms a first interface with the free layer.

23. The MRAM device according to claim 22, wherein the amorphous layer is in direct contact with a top electrode and forms a second interface with the top electrode.

24. The MRAM device according to claim 23, wherein the top electrode is a ruthenium top electrode having a hexagonal close packed (hcp) crystalline structure.

25. The MRAM device according to claim 21, wherein the amorphous layer is made of metals having amorphous structure and has a thickness of about 0.1 nm to 5.0 nm.

26. The MRAM device according to claim 25, wherein the amorphous layer comprises non-magnetic metals including Ta, Ti or Al, magnetic metals including CoFeB, FeB or CoB, or oxides including AlO, MgO, $TaO_2$ or RuO.

27. The MRAM device according to claim 21, wherein the light-element sink layer is made of metals having ability of absorbing light elements diffused from the free layer.

28. The MRAM device according to claim 27, wherein the light-element sink layer comprises non-magnetic metals including Ta, Ti or Zr or magnetic materials including Fe or its alloys.

29. The MRAM device according to claim 21, wherein the diffusion-stop layer is made of materials having low mobility at high temperature of above 400° C.

30. The MRAM device according to claim 29, wherein the diffusion-stop layer comprises non-magnetic metals including Ru, Mo, W or alloys thereof, or oxides including MgO, TaO, AlO.

31. The MRAM device according to claim 21, wherein the tunnel barrier layer comprises an insulator comprising MgO, $AlO_x$, MgAlO, MgZnO, HfO, or any combination thereof.

32. The MRAM device according to claim 21, wherein the free layer comprises Fe, Co, B, Ni, or any combination thereof.

33. The MRAM device according to claim 21, wherein the reference layer comprises a magnetic material comprising Co and Fe.

34. The MRAM device according to claim 21, wherein the reference layer comprises CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

35. The MRAM device according to claim 21, wherein the reference layer comprises a magnetic superlattice structure comprising repeated alternating layers of two or more materials, including $(Co/Pt)_n$, $(Co/Pd)_n$, $(Co/Ni)_n$, $(CoFe/Pt)_n$, $(Co/Pt(Pd))_n$, or any combination thereof.

36. The MRAM device according to claim 21, wherein the reference layer is disposed on a bottom electrode comprising NiCr, Ru, Cu, Ta, TaN, Ti, TiN, or any combination thereof.

* * * * *